(12) United States Patent
Henzler et al.

(10) Patent No.: US 7,688,126 B2
(45) Date of Patent: Mar. 30, 2010

(54) TIME DELAY CIRCUIT AND TIME TO DIGITAL CONVERTER

(75) Inventors: Stephan Henzler, Taufkirchen (DE); Siegmar Köppe, Munich (DE); Dominik Lorenz, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/362,247

(22) Filed: Jan. 29, 2009

(65) Prior Publication Data

US 2009/0128322 A1    May 21, 2009

Related U.S. Application Data

(62) Division of application No. 11/728,442, filed on Mar. 26, 2007, now Pat. No. 7,564,284.

(51) Int. Cl.
*H03H 11/26* (2006.01)
(52) U.S. Cl. .................. 327/261; 327/263; 327/233; 327/235

(58) Field of Classification Search .................. 327/3, 327/12, 231, 233–236, 261–263, 276, 277, 327/291, 298, 299
See application file for complete search history.

(56) References Cited

U.S. PATENT DOCUMENTS

| | | | |
|---|---|---|---|
| 4,433,919 A | | 2/1984 | Hoppe |
| 5,694,377 A | * | 12/1997 | Kushnick ............... 368/120 |
| 6,225,847 B1 | | 5/2001 | Kim |
| 6,629,255 B1 | | 9/2003 | Barkatullah et al. |
| 6,970,521 B2 | * | 11/2005 | Dosho ................... 375/340 |
| 7,116,147 B2 | | 10/2006 | Kase |
| 7,205,924 B2 | * | 4/2007 | Vemulapalli et al. ........ 341/166 |
| 7,256,636 B2 | | 8/2007 | Kumar et al. |

* cited by examiner

*Primary Examiner*—An T Luu
(74) *Attorney, Agent, or Firm*—Eschweiller & Associates, LLC

(57) ABSTRACT

A time delay circuit is disclosed and includes a delay line with a first delay circuit and at least a second delay circuit connected downstream. An interpolation circuit is used to generate intermediate signals derived by delayed successive signals in the delay line.

22 Claims, 11 Drawing Sheets

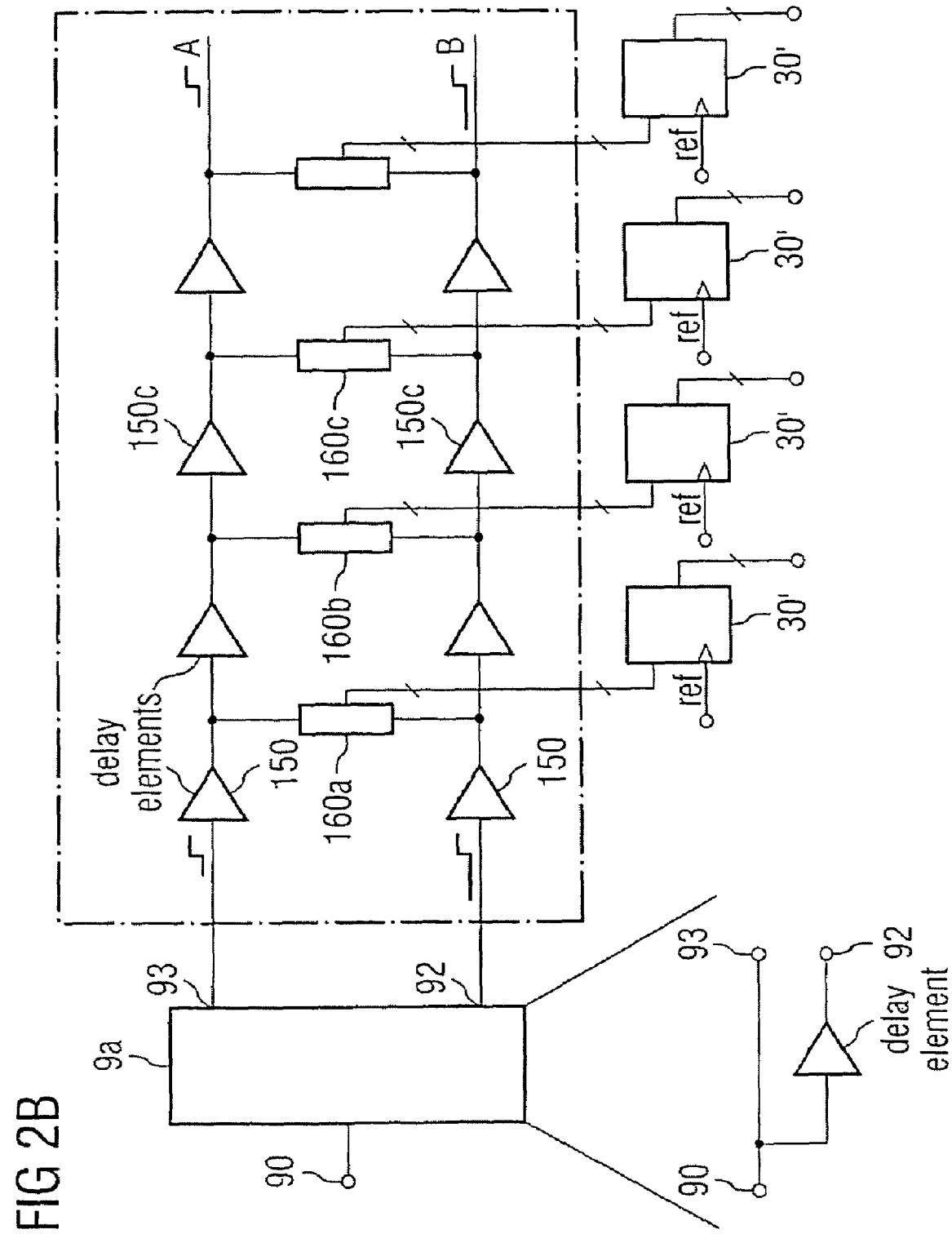

Fractional-N modulator with digital forward branch.

US 7,688,126 B2

TIME DELAY CIRCUIT AND TIME TO DIGITAL CONVERTER

REFERENCE TO RELATED APPLICATIONS

This application is a divisional application of U.S. application Ser. No. 11/728,442, entitled, "Time Delay Circuit and Time to Digital Converter," that was filed on Mar. 26, 2007, now U.S. Pat. No. 7,564,284 and is hereby incorporated by reference in its entirety.

FIELD OF THE INVENTION

The invention relates to a time delay circuit and to a time to digital converter.

BACKGROUND

In electronic instrumentation and signal processing, a time to digital converter (abbreviated TDC) is a device for converting a signal of sporadic or periodic pulses into a digital representation of their time indices.

SHORT DESCRIPTION OF THE DRAWINGS

Figure 1:
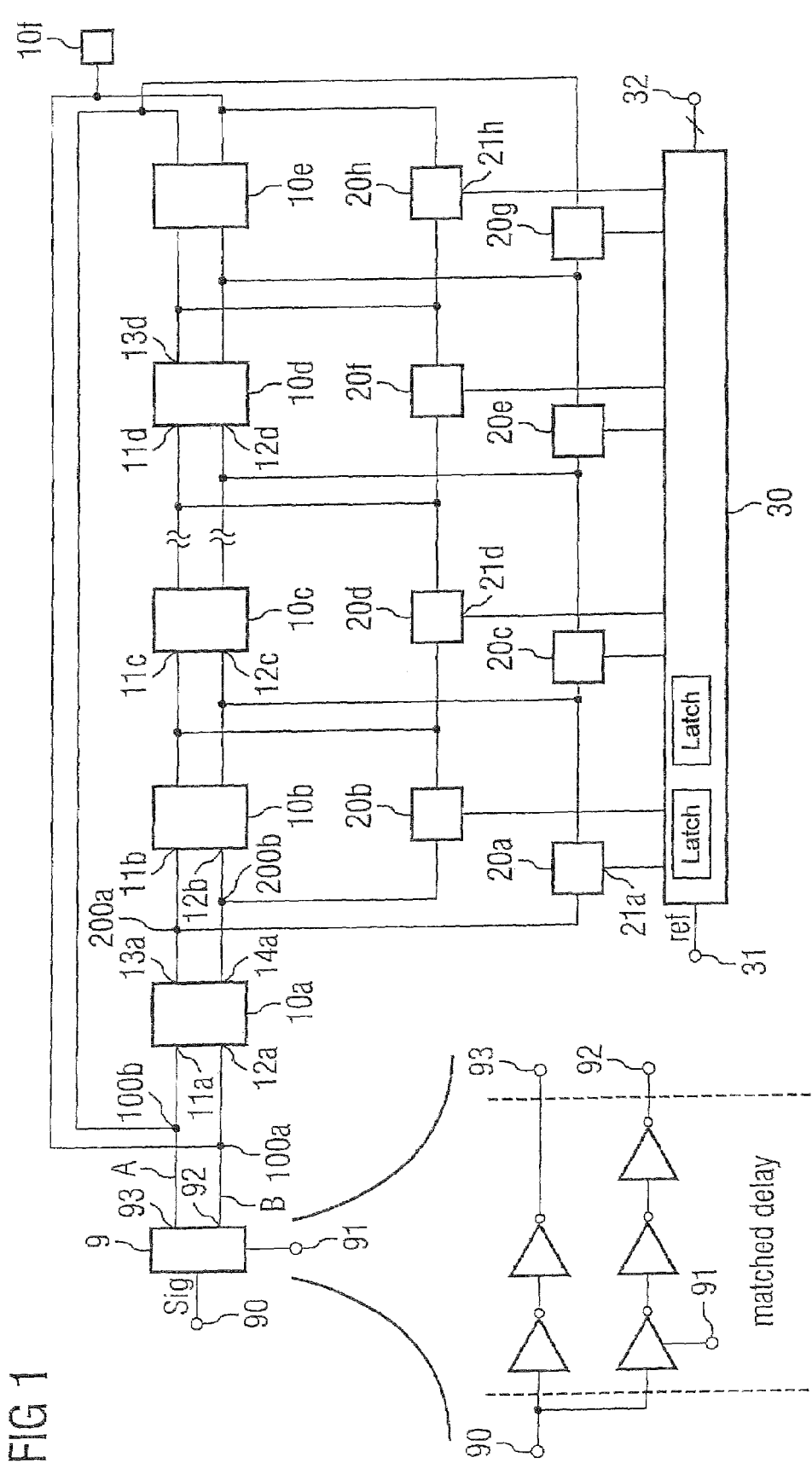
Figure 2A:
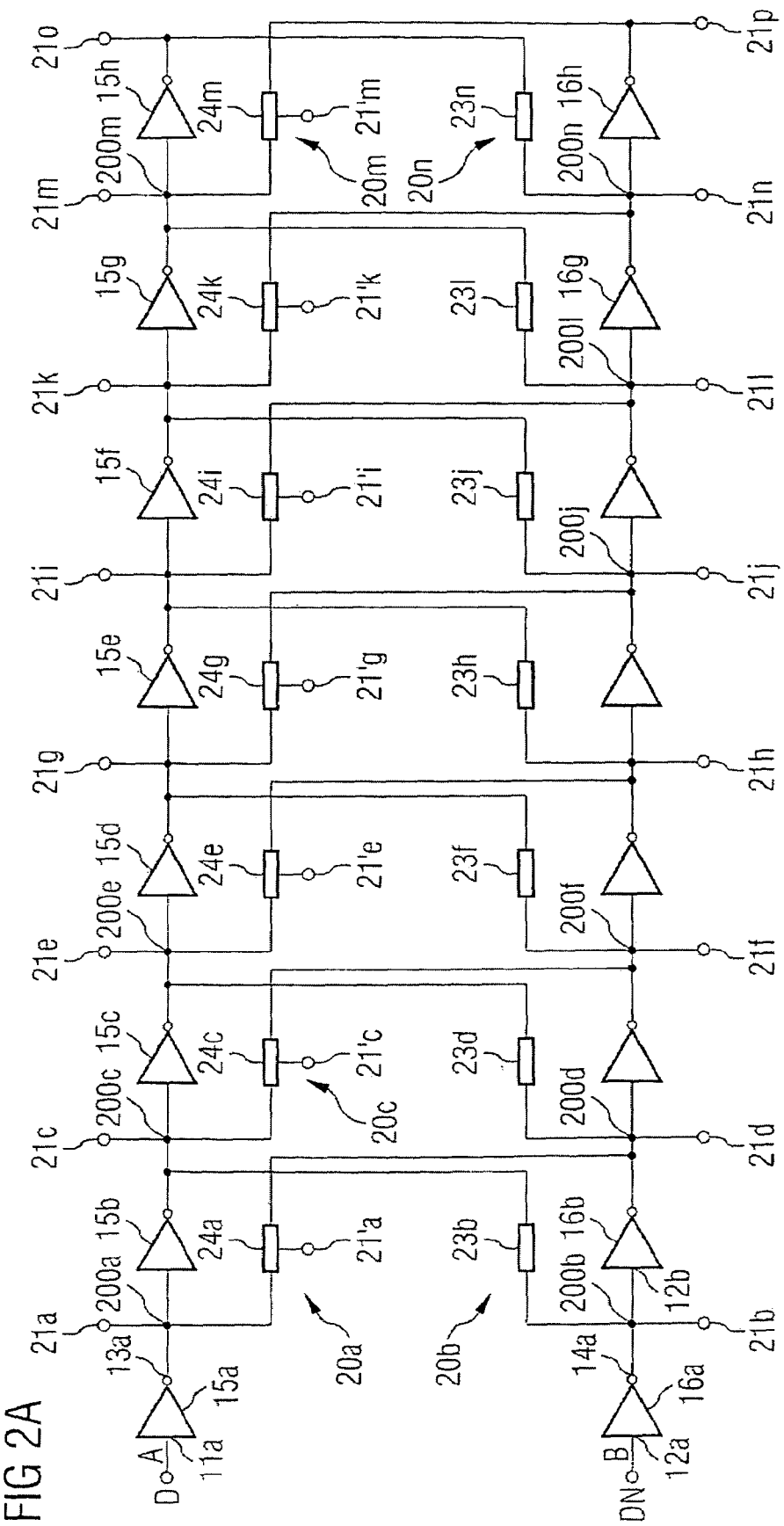
Figure 3:
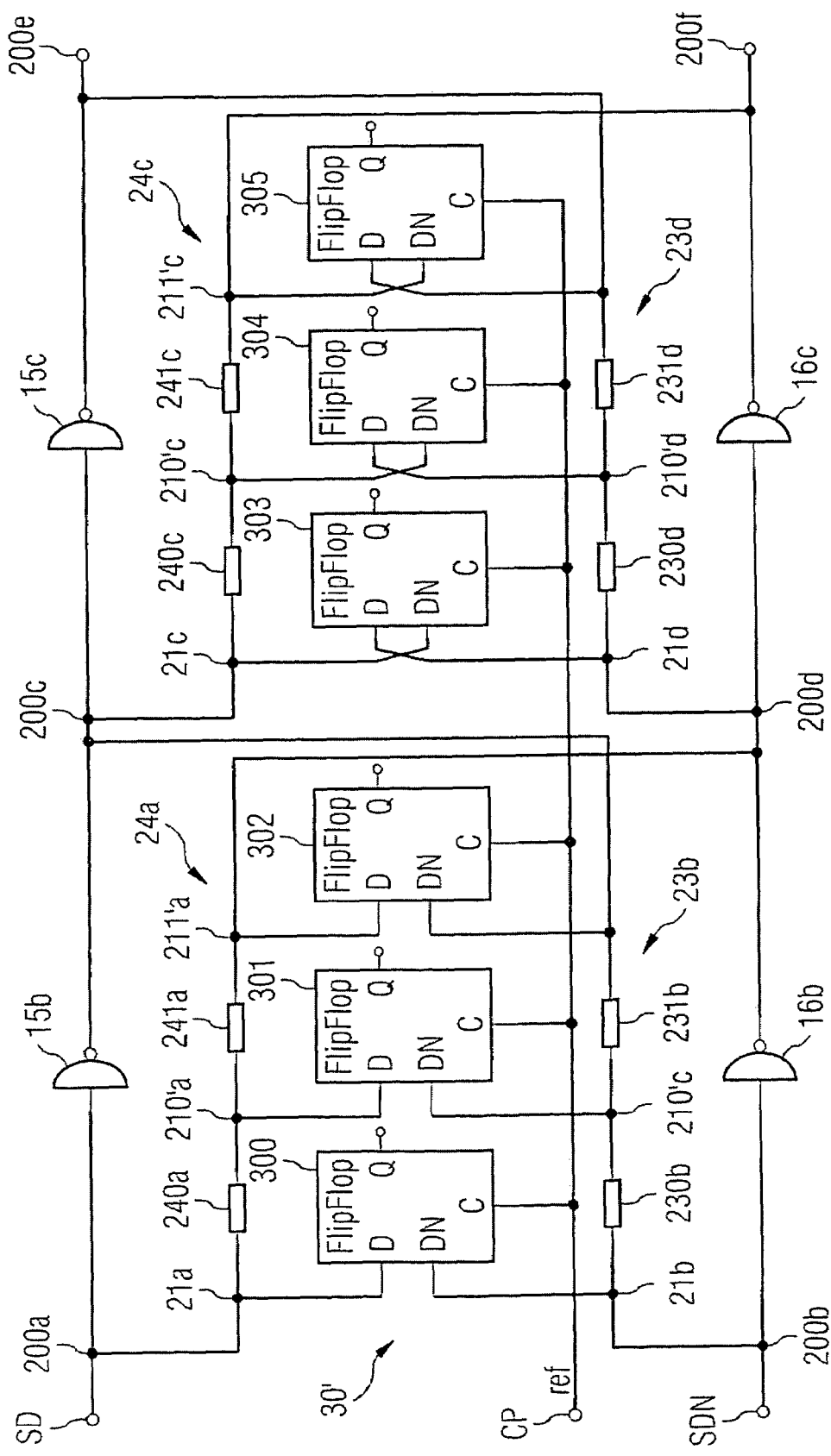
Figure 4:
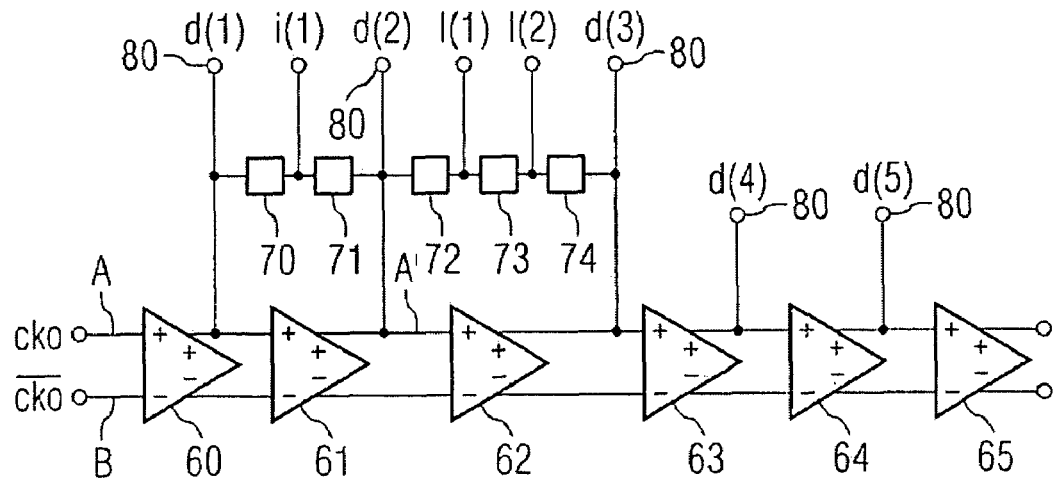
Figure 5:
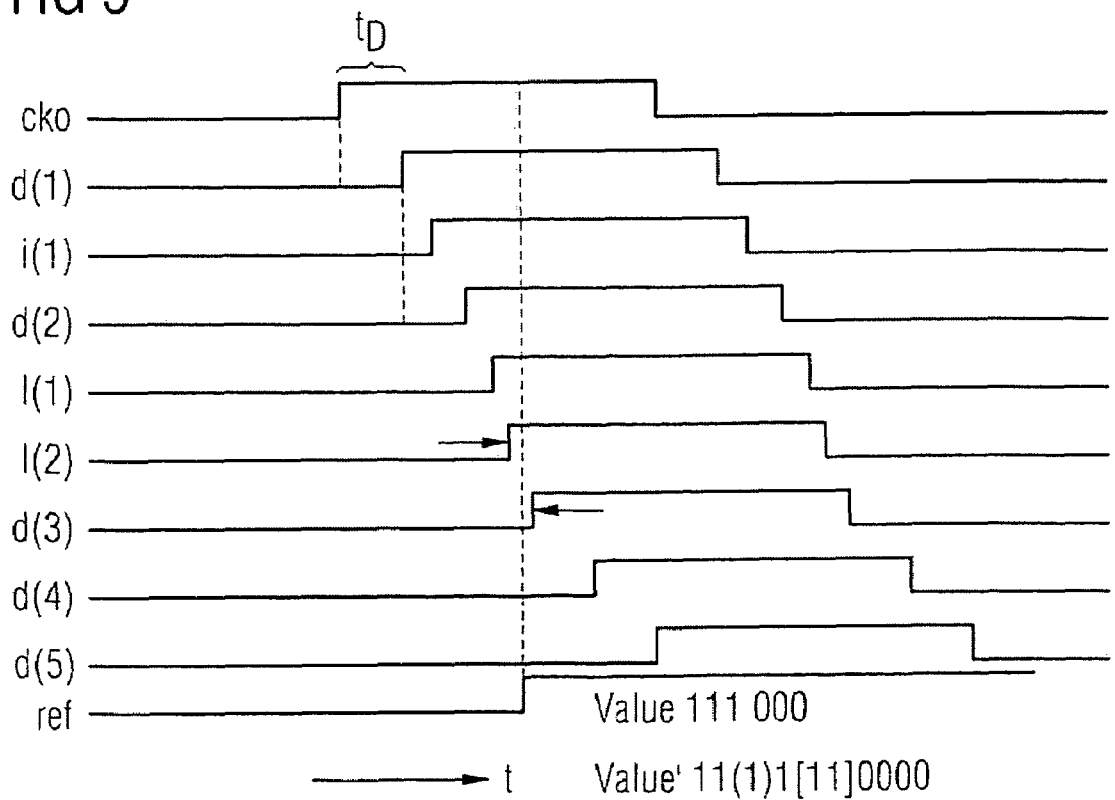
Figure 6A:
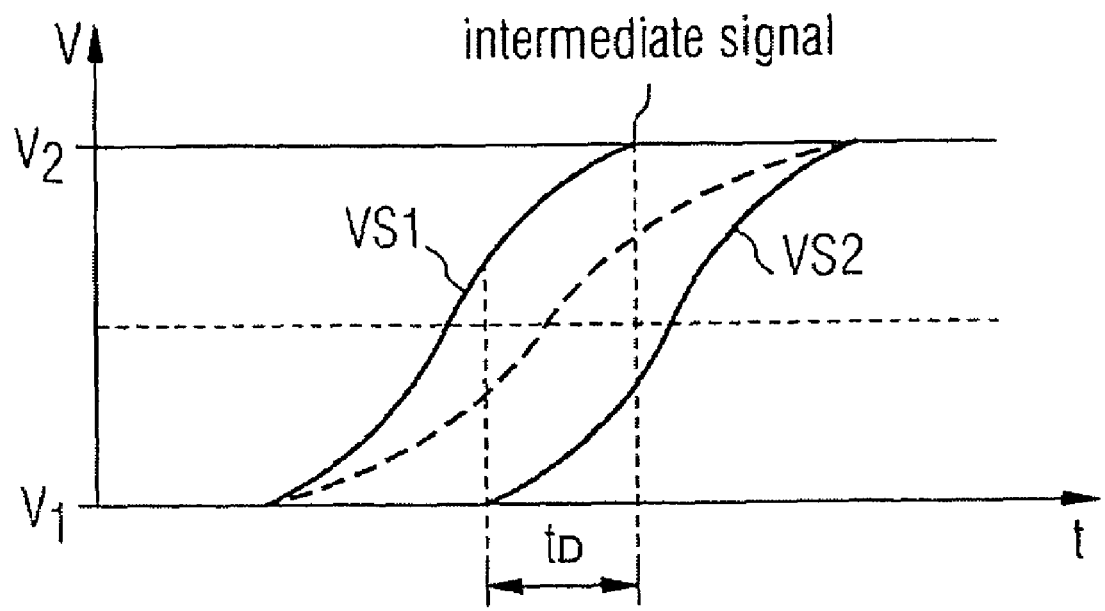
Figure 6B:
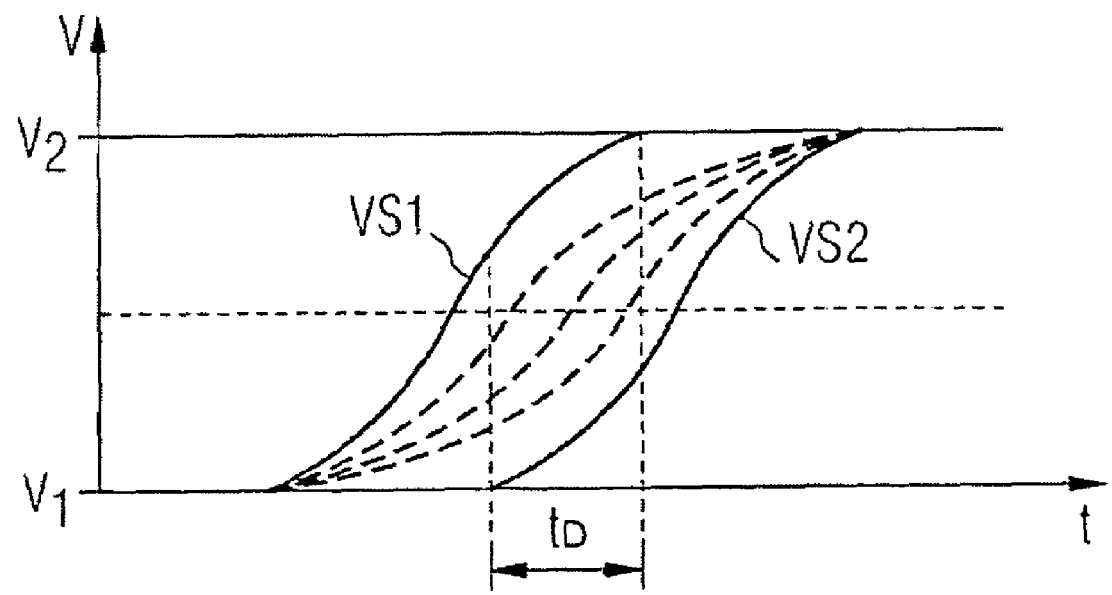
Figure 7A:
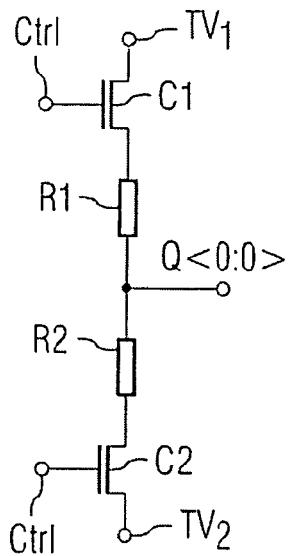
Figure 7B:
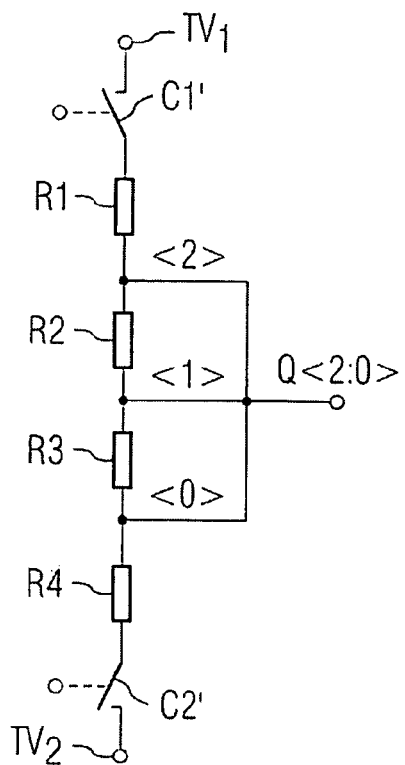
Figure 8:
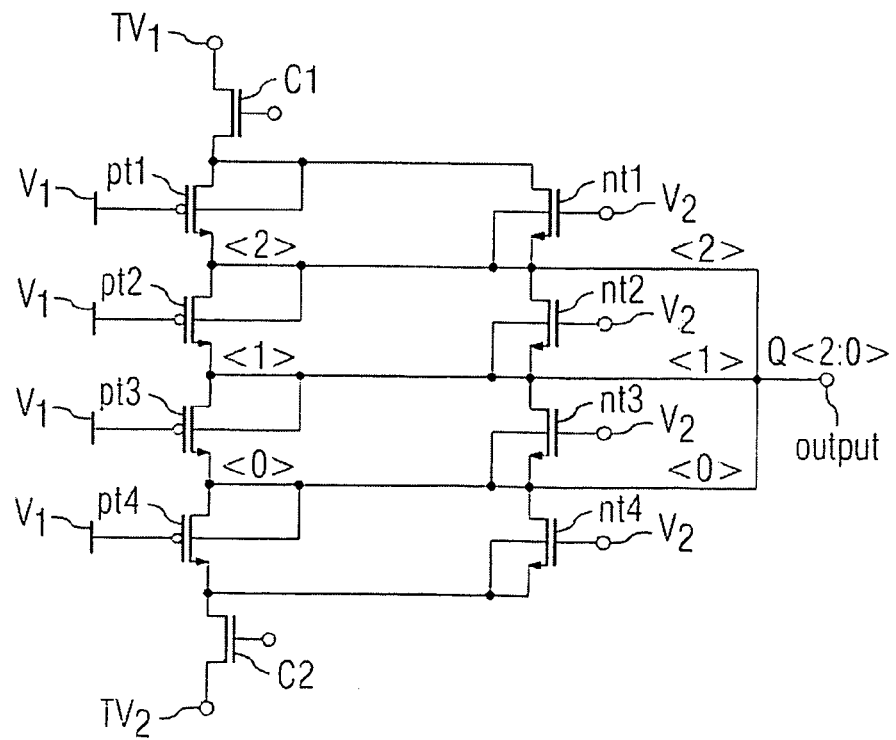
Figure 9:
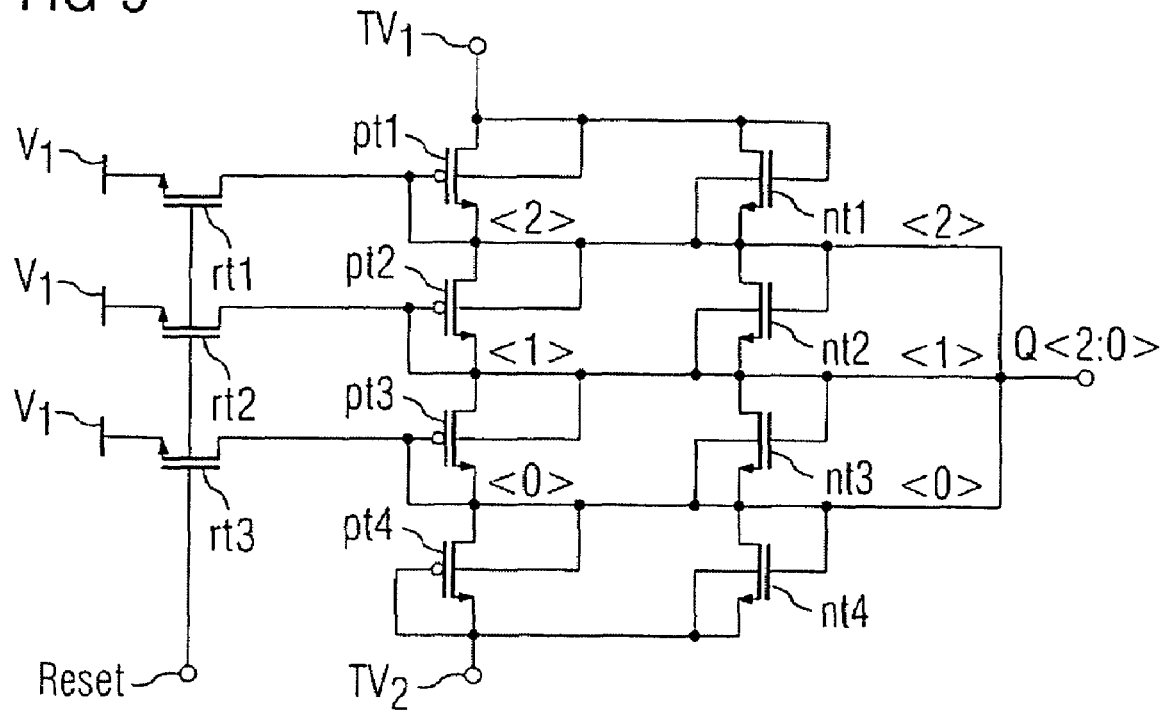
Figure 10:
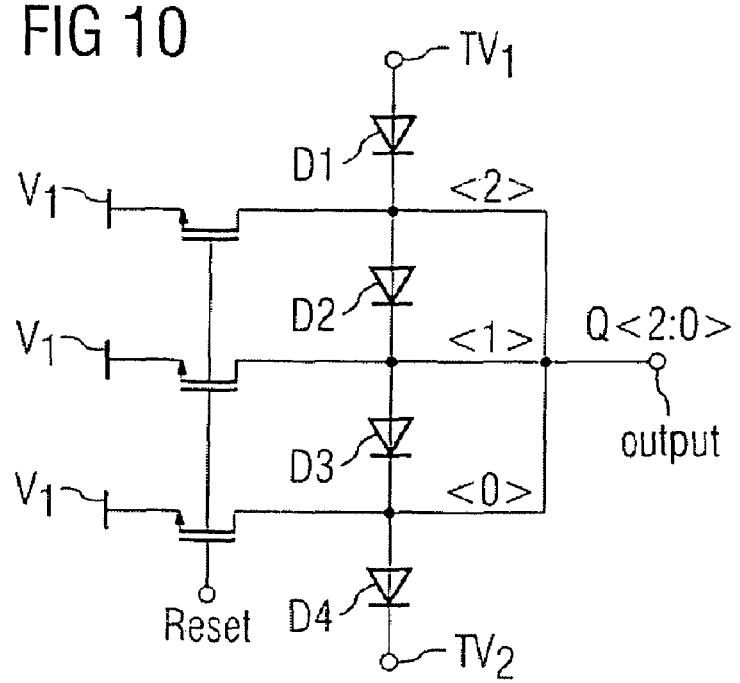
Figure 11:
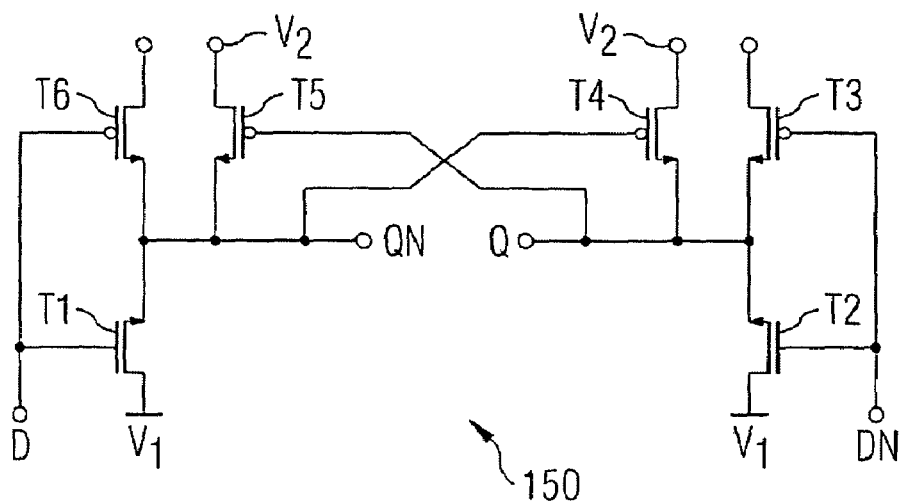
Figure 12:
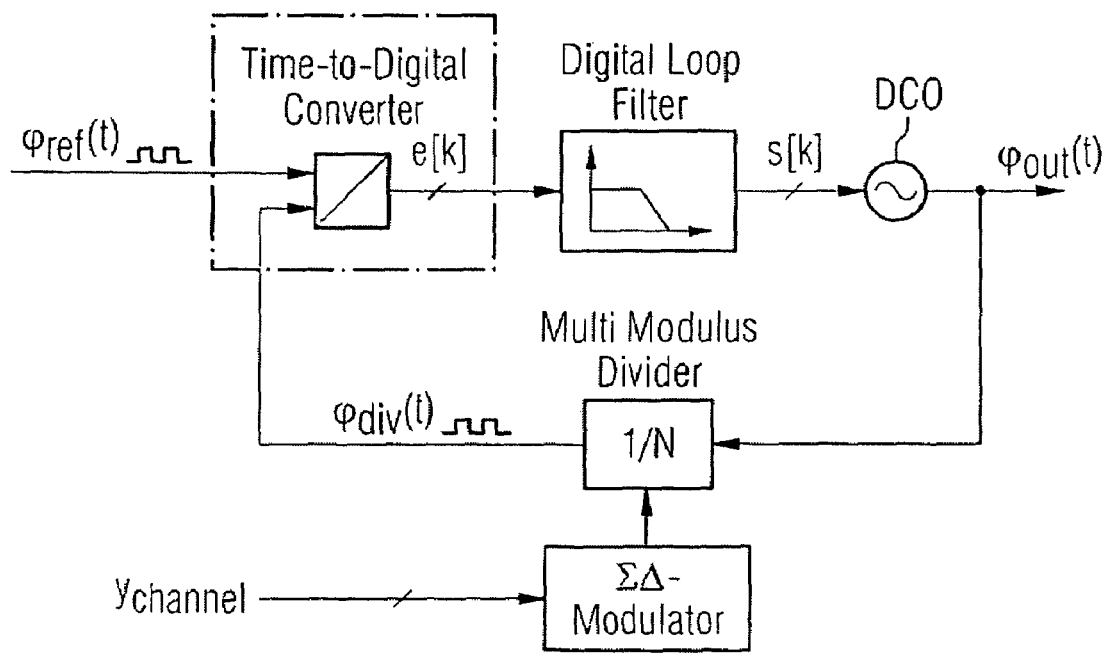
Figure 13:
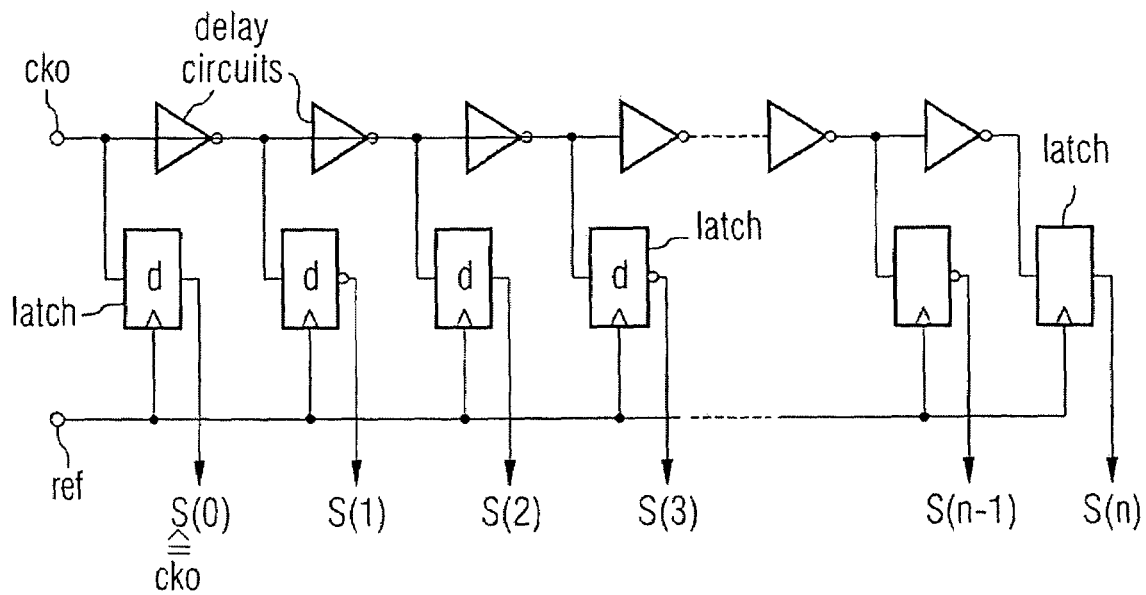
Figure 14:
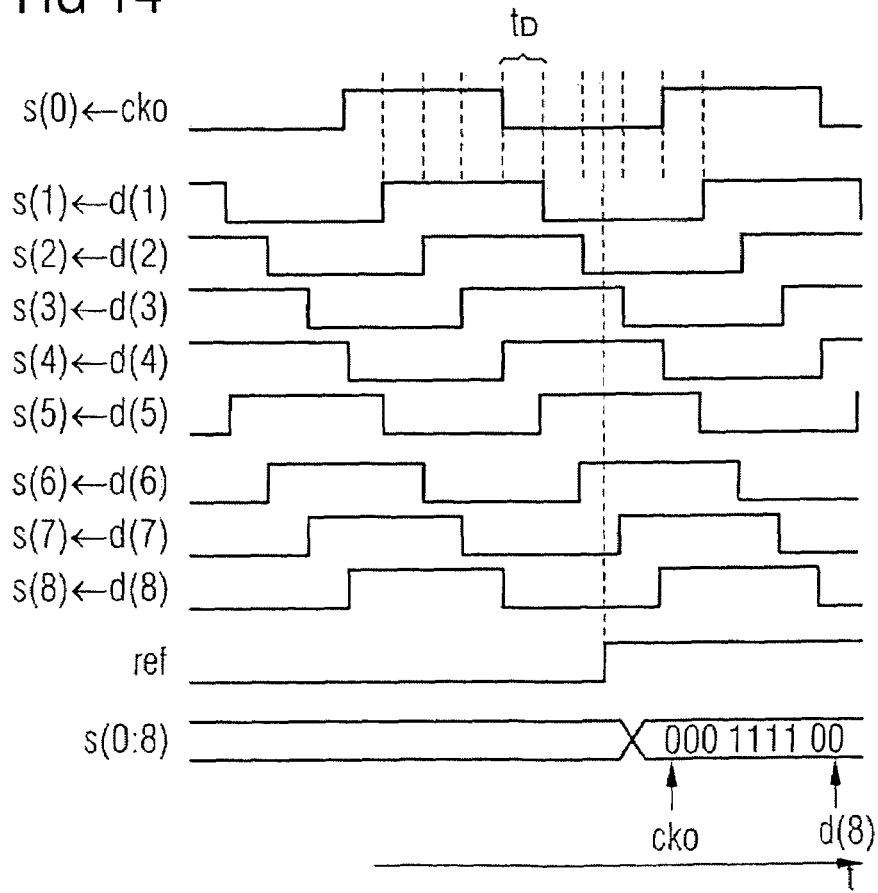
Figure 15:
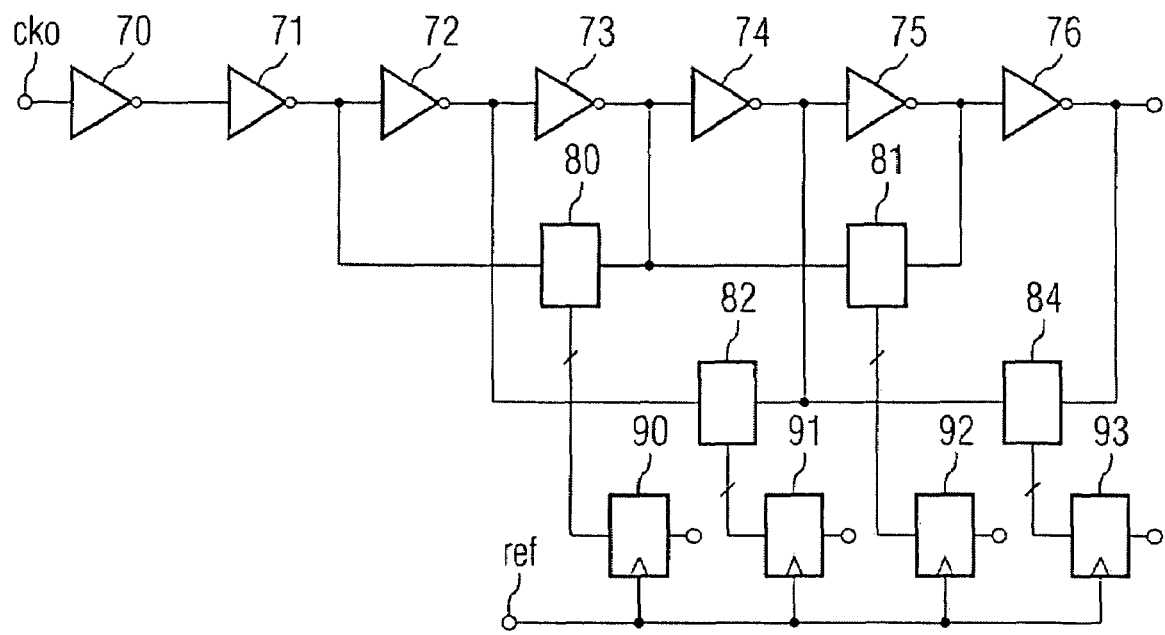
Figure 16:
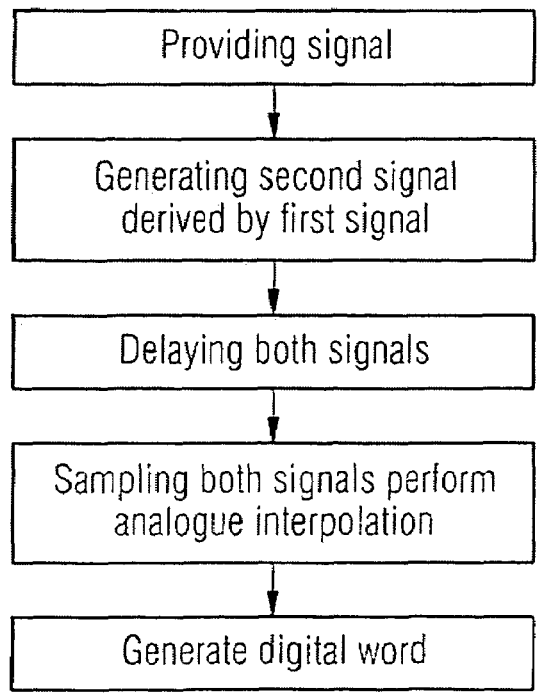

The invention is explained in detail below by way of exemplary embodiments with reference to the drawings in which FIG. 1 illustrates a first embodiment of a time to digital converter, FIG. 2A illustrates a section of a first embodiment of a time delay circuit, FIG. 2B illustrates a section of a second embodiment of a time delay converter, FIG. 3 illustrates a section of a third embodiment of a time delay converter, FIG. 4 illustrates a section of a fourth embodiment of a time delay converter, FIG. 5 is a timing diagram illustrating output signals with respect to a reference signal according to the embodiment of FIG. 4, FIG. 6A shows a first signal-time diagram illustrating the transition from low to high levels of delayed signals, FIG. 6B shows a second signal-time diagram illustrating the transition from low to high levels of delayed signals, FIG. 7A, 7B show a first and a second embodiment of an interpolation circuit, FIG. 8 illustrates a third embodiment of an interpolation circuit, FIG. 9 illustrates a fourth embodiment of an interpolation circuit, FIG. 10 illustrates a fifth embodiment of an interpolation circuit, FIG. 11 illustrates an embodiment of a delay circuit, FIG. 12 illustrates a phase locked loop with a time to digital converter, FIG. 13 illustrates an embodiment of a time to digital converter, FIG. 14 illustrates different signals over time in the time to digital converter according to FIG. 13, FIG. 15 illustrates a section of a fifth embodiment of a time to digital converter, and FIG. 16 is a flow chart illustrating an embodiment for a method of time to digital conversion.

DETAILED DESCRIPTION

In the following description, further aspects and embodiments of the present invention are disclosed. In addition reference is made to the accompanying drawings which form a part hereof, and in which is shown a way of illustration in which the invention may be practiced. The embodiments of the drawings present a discussion in order to provide a better understanding of one or more aspects of the present invention. Some of those embodiments may include general elements of different devices. Such embodiments shall visualize different aspects to deepen the understanding of the present invention. The disclosure is not intended to limit the features or key element of the invention to a specific embodiment. Rather, the different elements, aspects and features disclosed in the embodiments presented can be combined with each other or replaced in different ways by a person skilled in the art to achieve one or more advantages of the present invention. Further, a person skilled in the art may use variations or additional devices to realize the subject matter for which protection is sought. Therefore, it is to be understood that other embodiments may be utilized and structural or logical changes may be made without departing from the scope of the invention. The elements of the drawings are not necessarily to scale relative to each other. For illustration purposes elements may be named differently. Of course, the elements are not restricted to the embodiments shown herein. Like reference numerals designate corresponding similar part.

Time to digital converters are digital circuits which may be used to convert a pulse width or a time difference between two events into digital values. The time difference may be derived from two signals compared to each other. For example, if the two signals comprise a rising or falling edge, the difference between two successive edges of the first and second signal can be measured and converted into a digital value.

FIG. 13 shows an illustration of an embodiment of a time to digital converter with a signal cko to be converted. The converter comprises a time delay circuit having a plurality of single delay circuits connected in series. Each of the single delay circuits in this embodiment comprises an inverter circuit. Each of the inverter circuits delay the signal cko by a specific amount of time called a stage delay time. The stage delay time of the inverters is dependent on various design specific parameters like, for example, a size of the transistor gates used in the inverter. The outputs of each delay circuit are connected to respective latch circuits d, which are clocked and sampled by a reference signal ref. The latch circuits are therefore triggered by the reference signal ref and sample the signals at the outputs of each of the inverters within the time delay circuitry. The output values s(0) to s(n) represent different bits of a digital value corresponding to the time difference between a clock edge of the signal cko with respect to the successive edge of the reference signal ref.

FIG. 14 is a timing diagram that shows the results over time for the signal cko to be converted as well as the results of the delayed and sampled signals d(1) to d(8) corresponding to a nine bit digital value s(0:8). The first delayed signal d(1) corresponds to the first signal cko and is delayed by a specific time $t_D$. The time $t_D$ is given by the stage delay of the first delay circuit of the time delay circuit according to FIG. 13. When the signal cko is passing through the delay circuits of the time delay circuit, the total delay by the stage delay $t_D$ in each inverter is accumulating. When the delayed signal cko is sampled by the reference signal ref, some latches comprise a logical high value, while other comprises a logical low level, in response to the pulse width of the signal cko. In this example, the latches d(3) to d(6) comprise a high value "1" while the other latches d(1), d(2) and d(7), d(8) are at low level "0". As a result, the digital nine bit value s(0:8) represents the pulse width of the signal cko. Also the time difference between the successive edges of the signal to be measured and a reference signal can be derived.

However, the stage delay of a single delay circuit specifies the maximum resolution with respect to the reference signal. By decreasing the stage delay, the resolution can be enhanced. Nevertheless, there seems to be a minimum stage delay for an inverter circuit as seen in FIG. 13 resulting from design specific parameters and technological limitations.

In order to increase the resolution when converting time based signals, FIG. 1 illustrates an embodiment for a time to digital converter using interpolation techniques. The time to digital converter shown herein comprises a time delay circuit having a first delay line A and a second delay line B. In each of the delay lines A and B, a signal is propagating through a plurality of delay circuits $10a$ to $10e$, of which only some are shown for illustration purposes. Both signals in the first and second delay lines A and B are derived from a single signal sig at input terminal 90. The input terminal 90 is connected to a conversion unit 9 which provides a first signal on the first delay line at terminal 93 and an inverted signal with respect to the first signal on the second delay line at terminal 92. Both signals are derived by the signal sig at terminal 90. Of course, the conversion unit 9 may also generate two complementary signals by itself. For instance, the conversion unit 9 may comprise a differential oscillator providing a first clock signal and a second clock signal inverted and substantially synchronized with respect to the first clock signal. In this embodiment, the conversion unit is implemented in a way that minimizes the skew of the complementary signals 92 and 93.

The inverted signal on terminal 92 may be synchronized with respect to the first non-inverted signal, which results in a substantially equal transition from low level to high level and from high level to low level, respectively. For this purpose, the conversion circuit 9 comprises an output terminal 93 coupled to the input terminal 90 via a first chain of two inverter circuits and a second output terminal 92 coupled to a second chain of three inverters. All inverters may comprise a reset terminal 91 to receive a reset signal. The inverter chain, which is coupled to the second delay line B via terminal 92 delays the signal at input terminal 90 by the specific delay time and inverts the signal's level. The first inverter chain coupled to terminal 93 for the delay line A does not invert the signal with respect to the signal sig applied at terminal 90. However it delays the signal as well. The delay time of the first chain is selected to be substantially equal to the delay time of the second chain. This can be achieved for example using different inverter parameter and/or different manufacturing techniques for both chains. For instance, the gates of the transistors of the first inverter chain may be different in size compared to the gates of the second chain's transistors. Also the doping material and or concentration can be different.

Consequently, the signal at terminal 92 connected to the second delay line B is inverted but comprises substantially the same delay with respect to the signal at terminal 93 connected to the first delay line. The delay of the inverter of both inverter chains can be in the range of the stage delay of the delay circuits $10a$ to $10e$, but may also comprise different values. Also, the number of inverters in each chain can be different.

The time delay circuit with first and second delay line A and B also comprises a closed loop in which the output terminals of the last delay circuit $10e$ are coupled to respective nodes $100a$, $100b$ between the conversion circuit 9 and the first delay circuit $10a$. The nodes may comprise a multiplexer or other coupling elements. A counter $10f$ is connected to one of the delay lines, counting complete cycles of the delayed signals. This embodiment may reduce the total number of delay elements in the delay chain due to the feedback path and a repeated transition through the delay line. The delay line can also comprise a plurality of further delay elements connected in series without feedback. Consequently, the counter $10f$ may not be required in such embodiment.

While only five delay circuits $10a$ to $10e$ are shown herein for the time delay circuit in this embodiment, a plurality of delay circuits may be used. Each of the delay circuits $10a$ to $10e$ comprises a first input terminal $11a$ and a second input terminal $12a$. The input terminals $11a$ and $12a$, respectively, are connected to delay elements within the respective delay circuit, both delay elements having the substantially same stage delay. The delay elements of each delay stage $10a$ to $10e$ also invert the level of a signal applied to one of its input and provide an inverted signal at its output. Hence, a signal at one of the input terminals is provided as an inverted signal at the corresponding output. Further, the stage delay of the delay element may be substantially equal and also in the range of the stage delay of the inverter of the conversion unit 9. The delayed and inverted signals of the first delay line A and the second delay line B are provided at the output terminal $13a$ and $14a$, respectively. The output terminals $13a$ and $14a$ are connected to input terminals of a further delay circuit connected downstream.

In this embodiment, the output terminals of the first delay circuit $10a$ are connected to input terminals $11b$, $12b$ of a second delay circuit $10b$. The second delay circuit $10b$ also comprises delay and inverter elements having substantially the same stage delay and may also comprise the same stage delay with respect to the delay elements of the first delay circuit $10a$. The outputs of the second delay circuit $10b$ are connected to a third delay and inverting circuit $10c$, which in turn is connected upstream to a fourth delay circuit $10d$ and so on.

Nodes connected to respective interpolation circuits $20a$ to $20h$ are arranged between two successive delay circuits. For example, the node $200a$ on the first delay line A coupled between the output terminal $13a$ and the input terminal $11b$ is connected to a first interpolation circuit $20a$. The node $200b$ disposed between terminals $14a$ of the first delay circuit $10a$ and terminal $12b$ of the second delay circuit $10b$ in the second delay line B is connected to a second interpolation circuit $20b$. The output of the first interpolation circuit $20a$ is connected to the output of the second delay circuit $10b$ in delay line B. Further, the output of the second interpolation circuit $20b$ is connected to the output terminal of the second delay circuit $10b$ in delay line A. In other words, the interpolation circuits $20a$ and $20b$ are connected with their input terminals to one of the delay lines A and B and with their output terminals to the respective other delay line B, A.

In addition, further interpolation circuits $20c$ to $20h$ are provided. The interpolation circuits $20c$ and $20d$ are connected with their input terminals to the delay lines B and A, respectively, and also to the output terminals of the interpolation circuits $20a$ and $20b$. The output terminals of the interpolation circuits $20c$ and $20d$ are in turn connected to the output terminals of the delay circuit $10c$ at the respective other delay line. Particularly, interpolation circuit $20d$ is connected with its input terminal to the input terminal $11c$ of delay line A and with its output terminal to the output of delay circuit $10c$ at delay line B. The interpolation circuit $20c$ is connected to interpolation circuit $20a$ and $20e$ and to input terminal $12c$ of delay circuit $10c$ in delay line B as well as to output terminal of delay circuit $10c$ in delay line A.

The additional interpolation circuits $20e$, $20f$ and $20g$, $20h$ are coupled to the respective delay lines A, B between the delay circuits $10d$, $10e$ in a uniform manner.

The interconnection of the interpolation circuits at the input and output terminals of the delay circuits ensure the same logic levels and/or transitions of the signal to be applied to the interpolation circuits 20a to 20h. In other words, a falling edge of a signal at node 200a is inverted and provided at the output of circuit 10b in delay line A. At node 200b a rising edge is applied. Therefore, two signals with a rising edge or a falling edge respectively are applied to interpolation circuit 20b. If the delay circuits do not invert the signal applied to their inputs, the interpolation circuits can be connected to one of the delay lines.

When a signal sig is applied at the input terminal 90, the signal is inverted and applied at output terminal 92 of signal line B. The non-inverted signal is provided at terminal 93 of delay line A. Both signals are substantially synchronized and propagate through the time delay circuit and through the delay circuits 10a to 10e. Due to the delay of the delay circuits 10a to 10e, they also comprise a time difference of one stage delay unit. For example, if a signal with a rising edge is provided at input terminal 12c of delay circuit 10c in the delay line B, a rising edge also applies in delay line A at the output terminals of the delay circuit 10c.

The interpolation circuits 20a to 20h generate intermediate signals based on an analogue interpolation between the signals on delay line A and delay line B which have a time difference and a delay of one stage delay unit. For this purpose, they use the rise time or the fall time during transition of the signal in delay line A and B from a low level to a high level and vice-versa. The interpolation circuits 20a to 20h may generate an output signal derived directly by the level of the signals in delay lines A and B and also at least one intermediate signal derived by delayed successive signals in the first and second delay line A and B. Those intermediate signals may be also derived by clock edges of the delayed signal in the delay lines A and B. The results of the interpolation are provided at terminals 21a to 21h.

The time delay circuit shown in the embodiment of FIG. 1 may be connected to an evaluation circuit 30, which may comprise a latch circuit coupled to one of the output terminals 21a to 21h. The evaluation circuit 30 may also comprise a plurality of latch circuits, each of them connected to respective output terminals of the interpolation circuits. If the output terminals for the interpolation circuits provide not a single bit but a multi bit signal, which is the case if the output signals and the intermediate signal is provided, each bit of such multi bit signal is applied to a latch circuit.

The latch circuits of the evaluation circuit 30 are also coupled to the reference signal ref at input terminal 31. The latch circuits are sampling the value at its input in response to the reference signal ref, thereby generating a digital data word provided at output terminal 32 and corresponding to a time difference between the reference signal ref and the signal sig.

The interpolation in the circuits 20a to 20h increases the resolution of a time to digital conversion depending on the level of the analogue interpolation within the circuits 20a to 20h. While in this embodiment the outputs of each delay circuit 10a to 10e are coupled to the respective input terminals of corresponding interpolation circuits, other combinations of interpolation circuits and delay circuits are possible. For example, only some delay circuits may be coupled with their outputs to corresponding interpolation circuits. This may result in a varying resolution depending on the position of interpolation circuit connected to the time delay circuit. Alternatively, the level of interpolation within the circuits 20a to 20h may be varied. For example, some interpolation circuits may achieve a more precise scaled interpolation, resulting in a higher resolution for this area while other interpolation circuits may comprise a lower degree of interpolation.

FIG. 2A illustrates a section of an embodiment of a time delay circuit comprising a first delay line A and a second delay line B. Each of the delay lines A and B comprise a plurality of inverters 15a to 15h and 16a to 16h connected in series. The output terminals of the last inverter 15h, 16h in the first and second delay line A and B may be connected to further inverters not shown herein but can also looped back in a feedback loop. In this embodiment, each of the inverters 15a to 16h may comprise a specific stage delay resulting in a defined stage delay time. The delay time of the inverters in each delay line may be equal or at least highly similar in respect to each other. Of course, due to process variation and other external parameters during fabrication of the time delay circuit, some variations within the time delay may be statically introduced. Dynamic variations like, for instance, supply voltage jitter may occur.

Nevertheless, the stage delay time of the inverters may be in the range of the fall or rise time of each of the inverters. As a result, the rising edge of a first signal is overlapping with respect to a rising edge of a second signal delayed by one stage delay.

The signals D and DN applied to the first and the second delay line A and B in the embodiment according to FIG. 2A are substantially synchronized with respect to each other. The transition of the signal flanks or edges may occur at substantially the same time. When propagating through the time delay circuit of the respective delay lines A and B, signals with the same logic level or the same transition direction, from low to high or vice-versa have a time difference of one stage delay to each other. For example, the signal at output 14a of the first inverter 16a in delay line B may correspond to the output signal of the second inverter 15b at delay line A. The signal at output of inverter 15d of delay line A may correspond to the signal at node 200f of delay line B due to the introduced inversion in signal DN.

Each of the outputs of the inverters 15a to 15h in delay line A and 16a to 16h of delay line B is connected to a output node terminal 21a to 21o and 21b to 21p, respectively. These output terminals are part of respective interpolation circuits 20a to 20n. Each of the interpolation circuits also comprises a node 200a to 200n connected between an output of the respective inverter 15a to 15h and 16a to 16h in the respective delay line and the input of the inverter connected downstream. The interpolation circuits comprise an interpolation element 24a to 24m and 23b to 23n, respectively. The interpolation elements are disposed between an input of an inverter in one of the two delay lines A and B and the output of the corresponding inverter of the respective other delay line. For example, the interpolation element 24a of circuit 20a is connected to node 200a in delay line A, which is also the input terminal of inverter 15b and to node 200d at the output of inverter 16b of delay line B. Accordingly, the interpolation element 23b is coupled between node 200b in delay line B and 200c of delay line A.

In other words, the embodiment of a time delay circuit according to FIG. 2A comprises delay circuitry to provide delayed signals having a clock edge, the delay circuitry having a first pair of delay line circuits, for instance the inverters 15a, 16a, and at least a second pair of delay line circuits connected downstream, for example the inverters 15b, 16b. A first one of the pair of delay line circuits is arranged in the first delay line A, while the other one is arranged in the second delay line B. The interpolation circuits 20a, 20b having interpolation elements 24a or 23b are cross-coupled between the output terminals of the first pair of delay line circuits and the output terminals of the at least a second pair of delay line circuits.

The interpolation circuits generate intermediate signals by analogue interpolation and provide them at their respective output terminals 21'a to 21'm. For this purpose, they use the rise or fall time during the transition from a low level to a high level or vice-versa of the respective signals within the delay lines A and B.

FIG. 6A shows a graph of a voltage signal over time including an intermediate signal. The transition of a first signal VS1 from a low level at voltage $V_1$ to a high level at voltage $V_2$ corresponds to the transition of a logical "0" to a logical "1". The slope of the rising or falling flank or edge may depend on the design of the circuit's elements. It may also depend on the technology used, the fabrication process and other external parameters. In this non-limiting embodiment, the rise time is slightly bigger than a stage delay $t_D$. The fall time may be in the same range. The rise and fall time may also be slightly smaller than the stage delay. However, this can result in a flat transition region of the interpolated signal, which may increase the risk of some metastability in the sampling latches.

A second signal VS2 delayed by one stage delay time with respect to the first signal VS1 shows a similar rising behavior but with a time offset of the stage delay time $t_D$. If the rise time is in the range of the stage delay time, the first signal VS1 is still rising or falling when the signal VS2 delayed by the stage delay $t_D$ starts to rise or fall, respectively. This behavior can be seen in FIG. 6A in which the first signal VS1 is still rising while the delayed signal VS2 starts to rise as well.

Using analogue interpolation techniques generates at least one additional signal which in the embodiment according to FIG. 6 is roughly in the middle between the first and second signals VS1 and VS2. Additional intermediate signals may be generated using further interpolation techniques in another embodiment. Sampling not only the first and the delayed second signals but also the intermediate signal results in additional information and increases the overall resolution.

To generate an intermediate signal, FIG. 7A illustrates an embodiment of an interpolation circuit which may be selectively connected to the outputs of the respective delay circuits. The embodiment according to FIG. 7A comprises a passive voltage divider circuit having two tuneable resistors R1 and R2 connected in series between two switching transistors C1 and C2. The switching transistors C1, C2 are connected to terminal TV1 and TV2, respectively. A control signal Ctrl can be applied to the gates of the transistors for coupling the resistors with the respective delay path. With the switching transistors, the interpolation circuit can be selectively activated or deactivated. If, for instance a higher resolution is not required, the interpolation circuit can be deactivated to reduce overall power consumption. The node between the two tuneable resistors R1, R2 is connected to the output terminal for providing the intermediate signal Q. The resistive values of the two resistors R1, R2 may be equal to ensure that the intermediate signal is in the middle between the signal V1 and the signal V2. Different resistive values can be used to, for example, compensate for different effects like different buffers delays of the delay circuits in the first and second delay lines. The tuning allows to later compensate temperature effects or process variations. Also, finite time constants caused by parasitic capacitances connected to the output of the interpolator can be compensated.

FIG. 7B illustrates a further embodiment of a voltage divider comprising four resistors R1 to R4 connected in series between the switches C1' and C2'. The switches C1' and C2' couple the four resistors with the input terminals TV1 and TV2. If the switches C1' and C2' are closed the interpolation circuit generates three intermediate signals in total. If the resistors R1 to R4 comprise the same or similar values, the signals are equally arranged between the stage delay time $t_D$ of the first signal V1 and the second signal V2. The logic levels of the intermediate signals provide additional information and a fine scaled time resolution. As a result, the interpolation circuits generating intermediate signals between signal transitions of two successive signals increases the time resolution. The additional intermediate signals are still based on the delayed signals and derived by the delay time, which may be relatively insensitive against variations during fabrication.

FIG. 6B shows a transition of a rising signal from $V_1$ to voltage $V_2$ for the signals VS1 and VS2 and the intermediate signals generated by an interpolation circuit according to FIG. 7B. With the use of passive voltage dividers with resistors for the interpolation circuit, the resolution for a time measurement can be significantly increased depending on the number of additional generated intermediate signals.

In the foregoing embodiment the output of a delay element in one delay line was coupled to the input of the corresponding delay element in the other line. FIG. 2B illustrates another embodiment, wherein an interpolation circuit is arranged on the output of corresponding delay line element within the respective delay line. The time delay circuit as indicated by the dotted area comprises a first delay line A and a second delay line B, each of them having a plurality of delay elements 150 connected in series. The first and second delay lines A, B are connected to a conversion unit 9a, which provides a first signal at the first output terminal 93. A second output signal is provided at terminal 92. The second output signal comprises a delay with respect to the first signal as indicated in FIG. 2B, which may be in the range of a delay time of one of the delay element 150 in each line A, B.

The delay element 150 of each delay line may or may not comprise an inverting property and can be implemented as inverters. Still, each of them delays the signal at its respective input terminal and provides a delayed output signal. Consequently, the signal at the outputs of the delay element comprise the same logic level and/or the same transition direction. An interpolation circuit 160a to 160d is connected to respective output terminals of the delay line elements. The interpolation circuits provide one or more signals, which are applied to respective data latches 30'. These latches are read out in response to the clock signal ref.

FIG. 8 illustrates an alternative embodiment of an interpolation circuit. The circuit comprises a plurality of p-type field effect transistors pt1 to pt4 connected in series between switching transistors C1 and C2 respectively. The switching transistors are connected to terminals TV1 and TV2. At the gates of the switching transistors a control signal can be applied to selectively activate or deactivate the interpolation circuit. The gate terminals of the p-type transistors pt1 to pt4 are coupled to a reference potential V1. The reference potential may be the ground reference $V_{SS}$ but can also be slightly lower than $V_{SS}$. A substrate terminal of the first p-type transistor pt1 is coupled the terminal TV1 as well, while the substrate terminals of the other transistors pt2 to pt4 are connected with an output node between two adjacent connected transistors. Further, a second series circuit of n-type transistors nt1 to nt4 is connected parallel to the p-type transistors pt1 to pt4. The gate terminals of the n-type transistors are coupled to a high potential V2. Potential V2 may be the supply potential $V_{DD}$, but can also be higher than supply. The substrate terminal of the fourth transistor nt4 is connected to terminal TV2. The substrate terminals of the other n-type transistors are connected to respective nodes between two adjacent n-type transistors. These nodes between two n-type or p-type transistors are connected to the output terminal for providing a digital data word Q.

FIG. 9 illustrates another embodiment of an interpolation circuit. The interpolation circuit comprises a parallel circuit of four n-type transistors nt1 to nt4 and four p-type transistors pt1 to pt4 each connected in series between terminals TV1 and TV2. The gate terminal of the first n-type transistor nt1 as well as the substrate terminal of the first p-type transistor pt1 is coupled to a first terminal TV1 while the gate terminal of the last p-type transistor pt4 and the substrate terminal of transistor nt4 is connected to terminal TV2. Nodes in-between two p-type and n-type transistors are connected to the output terminal and to a respective transistor rt1 to rt3. The transistors rt1 to rt3 may receive a reset signal at their gate terminals and apply the potential V1 in response to the reset signal at the respective nodes. The reset signal may comprise $V_{SS}$ or a different potential ensuring resetting if the transistors. In addition, each of the nodes in between two adjacent transistors is connected to the gate of the p-type transistors pt1 to pt3 and n-type transistors nt2 to nt4 respectively. The substrate terminal of the p-type transistors pt2 to pt4 and the n-type transistors nt1 to nt3 are also connected to the respective nodes.

The nodes between two adjacent transistors provide a data word Q(2:0) representing three intermediate signals. In operation, the p-type or the n-type transistors are locked in response to the transition of the voltage at terminal TV1 and TV2 respectively. Still, the conductive transistors provide a voltage drop over their conductive channel. This voltage drop delays the signal from reaching the end level. Consequently, the transition of the signal generated by the interpolation circuit is between two successive transition of signals at terminals TV1 and TV2.

The embodiments according to FIGS. 8 and 9 are implemented using p- and n-type field effect transistors. Of course, bipolar transistors, MOSFET, MESFET or other type of transistors can be used as well. Pass gates, transmission gates or diode-connected transistors are also possible. FIG. 10 illustrates a further embodiment with 4 diodes D1 to D4 arranged between the terminals TV1 and TV2. Between two adjacent diodes, nodes are disposed coupled to an output terminal for providing a three bit data word Q(2:0) representing three slightly delayed intermediate signals. The diodes shown herein also achieve voltage division and provide a divided voltage in a predefined ratio at the output terminal Q. Compared to a voltage divider using resistors, the diodes comprise a transmission direction while suppress any signal in the opposite direction. Therefore, two series circuits comprising diodes have to be used, if the transitions of signals from low to high level or from high level to low level have to be determined.

Accordingly, the interpolation circuit may comprise a passive interpolation or an active interpolation network. The interpolation circuit divides the external voltage applied thereto in a predefined ratio and provides corresponding intermediate signals at an output terminal thereof. The predefined ratio and, for example, the number of intermediate signals provide a higher resolution in a time to digital converter which may be insensitive to variations on the delay lines and particularly on the delay line elements.

For a time delay line and the delay elements within such delay line, different implementations can be realized. A further embodiment of a time delay line can be seen in FIG. 4. The delay lines A and B are grouped together by the use of differential amplifiers 60 to 65 as delay line elements. Each amplifier comprises input terminals "+" and "−" and corresponding output terminals. Respective signals with a logical high and low level applied to its input terminals are provided at the respective output terminals with an amplitude also representing a logical low and high value. Of course, the gain of the amplifiers may be different to, for example, compensate for any dissipation effect.

The input terminals of the first differential amplifier 60 are adapted to receive the signal cko for the first delay line A and an inverted signal $\overline{cko}$ with respect to the signal cko for the second delay line B. The output of the first amplifier 60 is connected to the input terminals of the second differential amplifier 61 connected downstream. In each of the differential amplifiers 60 to 65, the output signal is inverted compared to the corresponding input signal and delayed.

The output terminals of each of the differential amplifiers 60 to 64 in the delay line A is connected to a corresponding node to provide a single bit d(1) to d(5) at terminals 80. In other words, the logical level at those terminals is sampled with respect to a reference signal. The results of the sampled logical levels can be combined to generate a digital word representing a time difference between the signal cko and a reference signal, for example. To further increase the resolution at some areas of the time delay circuit, different interpolation circuits are disposed. A first interpolation circuit having two resistors 70 and 71 connected in series is arranged between the first output terminal "+" of the first amplifier 60 and the output terminal "+" of the second amplifier 61. A node between the two resistors 70, 71 provides a first intermediate signal i(1). A second interpolation circuit comprising a voltage divider with three resistors 72 to 74 connected in series is disposed between the input terminal "+" of the third amplifier 62 and its corresponding output terminal "+". Two nodes are coupled between the resistors 72, 73 and 73, 74 of the second interpolation circuit to provide additional intermediate signals l(1) and l(2).

The resistors 70 to 74 shown herein may comprise the same or a different resistance. Because of the additional intermediate signal in the second interpolation circuit, its resolution is increased with respect to the first interpolation circuit. Accordingly, in one embodiment a time delay circuit may comprise different interpolation circuits, thereby producing a different overall resolution. While in this embodiment only two interpolation circuits are shown, further interpolation circuits may be used. In addition, interpolation circuits can be arranged at different positions of the time delay line. It is also possible in one embodiment to couple interpolation circuits alternating with the first or second delay line. This may reduce variations due to an uneven work load.

FIG. 5 illustrates the propagation of a signal cko over time and the corresponding logical values of the output signals d(1) to d(5) as well as the intermediate signals i(1) and l(1), l(2). For this example, the signal cko comprises a single pulse with a specific pulse width. The inverted signal $\overline{cko}$ is not shown herein for illustration purposes. The delay generated in each of the differential amplifiers results in a constant delayed pulse at the corresponding output terminals 80. Because the differential amplifier comprises substantially the same stage delay, the delay at two successive output terminals d(1) to d(5) is in the same range. The first intermediate signal i(1) generated by the first interpolation circuit also comprises a pulse. The pulse is delayed, but its rising edge and a falling edge is roughly in the middle between the respective rising and falling edges of the first and second output signal d(1) and d(2).

Accordingly, the two intermediate signals l(1) and l(2) also comprise equally spaced rising and falling edges with respect to the signals d(2) and d(3). If only the outputs of the amplifiers without the interpolation circuits are used to generate a corresponding digital value, some additional time information may be lost. In this example, the propagation of the signal cko was sampled at roughly ⅓ and ⅔ of the stage delay time $t_D$ when propagating through the amplifier 62 according to the embodiment of FIG. 4. The additional two intermediate signals l(1), l(2) generated by the second interpolation circuit will increase the overall resolution when sampling a signal propagating through the delay circuit elements coupled to the second interpolation circuit. Interpolation circuits generating different intermediate signals may increase the resolution in some areas of the delay circuit, thereby generating a digital word representing a time difference but also having a different resolution for word portions.

FIG. 3 shows a further embodiment of a section in a time to digital converter having a time delay circuit. The time delay circuit comprises a first delay line for a signal SD and a second delay line for an inverted signal SDN. The signal SDN is inverted but otherwise substantially synchronized with respect to the signal SD. The section of the first delay line shown herein comprises a first and second inverter 15b, 15c. The second delay line comprises a first inverter 16b and a second inverter 16c connected downstream thereto. In addition, an interpolation circuit comprising components 24a, 24c and 23b, 23d are arranged between the input terminals of one of the inverters in one of the delay lines coupled to the outputs of the inverters of the respective other delay line.

The inverters 15b of the first delay line and 16b of the second delay line can be grouped as a first pair of delay circuit elements. Accordingly, the inverters 16b and 16c of the first and second delay line are grouped to represent a second pair of delay circuit elements. In accordance, the interpolation circuit 24a is connected between a node 200a in the first delay line and node 200d in the second delay line. Accordingly, the second interpolation circuit 23b is disposed between node 200b and node 200c. The interpolation circuits 24c and 23d are disposed in a similar way cross coupling the input terminal of the respective second pair of inverters to its output terminals.

Each of the interpolation circuits 24a to 23d in one embodiment comprises a series circuit of first resistor and a second resistor. Nodes 210'a, 210'b, 210'c, 210'd between two respective resistors in each interpolation circuit provide an intermediate signal. The intermediate signal is applied to an evaluation circuit 30' comprising a plurality of flip-flops 300 to 305. More particularly, the intermediate signals of the interpolation circuits 24a and 23b are applied to a flip-flop 301, while the intermediate signals at nodes 210'c and 210'd of the third and fourth interpolation circuit 24c and 23d are applied to the flip-flop 304.

Each of the flip-flops 300 to 305 comprises a data input terminal D, an input terminal DN for the inverted signal, a clock terminal C and an output terminal Q. The clock terminals are coupled to a reference signal terminal CP for a reference signal ref. The first flip-flop 300 is connected with data input D to node 200a and with its input DN to node 200b of the second delay line. Flip-Flop 302 is connected with input D to node 200d between the inverters 16b and 16c and with input DN to node 200c. The flip-flop 301 latch the intermediate signal provided at terminals 210'a and 210'c. The flip-flop 303 always produces the same output signal as the flip-flop 302 and can be left out if appropriate. Finally, flip-flop 305 is coupled with its input D to node 200e at the output of the inverter 15c in the first delay line and with its input DN to the second delay line at node 200f.

In operation, the signals SD and SDN are propagating through the delay lines and the inverters 15c to 16c. In each inverter, they are inverted and delayed by a specific stage delay time set forth by the design of the corresponding inverters 15b to 16c. The flip-flops 300 to 305 store the corresponding logical levels in response the reference signal ref to the corresponding clock terminals C. The sampled signal in each of the flip-flops 300 to 305c are provided at their respective output terminals Q. The use of the signals in both delay lines reduces the effect of design of fabrication variations and improves robustness against any interference. The resolution shown in this embodiment is increased by a factor of two due to the use of the intermediate signal at terminals 210a to 210c.

The delay elements can be implemented in various ways. For example, in the embodiments according to FIG. 3, the delay in both delay lines are achieved by using single inverters having a specific delay time. In the embodiment according to FIG. 4, differential amplifiers connected to each other are used. It is not necessary that the outputs of the delay elements are rail-to-rail signals.

Another embodiment is shown in FIG. 11, in which a single inverter is replaced by a differential inverter. The differential inverter comprises a first pair and a second pair of two transistors T6, T1 and T3, T2 connected in series between the supply potential V2 and the reference potential V1. V1 can comprise Vss and V2 may comprise Vdd in one embodiment. The gate terminals of p-type transistors T6 and n-type transistor T1 is connected to an input terminal D. The gate of p-type transistor T3 and n-type transistor T2 is coupled to terminal DN. At the input terminals D, DN, a signal representing a logical level and the corresponding signal representing an inverted logical level can be applied. A node between the transistors T6, T1 and transistors T3, T2 is connected to an output terminal Q for the output signal and a terminal QN for the corresponding inverted output signal. In addition, a further p-type transistor T5, T4 is arranged in parallel to the p-type transistors of the respective transistor pairs in the circuit. The gate of transistor T4 is connected to output QN and transistor T5 is coupled with its gate to output Q.

In this embodiment, each of the transistors T3 to T6 is connected with the first and second terminal between the supply potential VDD and one of the output terminals Q and QN, respectively. When applying a signal and a corresponding inverted signal at the input terminals D and DN, the signal is inverted and provided at the output terminals Q and QN. The cross-coupled additional transistors T4, T5 increase the effect and improve the transition behavior. In an alternative embodiment, a cross coupled inverter pair can be connected in between Q and Qn. Current starved inverters can also be used as a delay element for the time to digital converter or the time delay line.

While in these embodiments two delay lines are used in-between the interpolation circuits, an analogue interpolation can be achieved as well with a single delay line. FIG. 15 illustrates an embodiment of a single delay line having a plurality of inverters 70 to 76 connected in series. Each inverter provides substantially the same stage delay. At the delay line, a logic signal cko is applied to the input of the first inverter 70. Further, interpolation circuits are disposed between an input terminal of a first inverter and an output terminal of a second inverter connected downstream to the first inverter. In other words, two inverters are arranged between the terminals of the interpolation circuit. Such arrangement ensures that signals with the same logical levels are processed within the interpolation circuits.

In this embodiment, a first interpolation circuit 80 is connected to the output terminal of the inverter 71 and an output terminal of an inverter 73. A second interpolation circuit 81 is coupled between the output terminals of inverters 73 and 75. Interpolation circuits 82 and 84 are connected between the terminals of inverters 72, 74 and 74, 76, respectively. Each of the interpolation circuits 80 to 84 provide a data word, which is applied to latch circuits 90 to 94. These latches may comprise flip-flops or other devices which are able to sample the single bit values of the data words at their respective inputs in response to a reference signal ref.

The interpolation circuits may be voltage dividers having a different or the same resistive elements connected in series. The single delay line can be used if two logically equal signals comprise a common transition region as, for example, seen in FIGS. 6A and 6B.

FIG. 12 illustrates an embodiment of a phase locked loop, in which a time to digital converter may be used. The phase locked loop comprises a forward branch having a time to digital converter with a first and a second signal input, a digital loop filter and a digital controlled oscillator DCO connected thereto. The output of the oscillator DCO is applied in a feedback path to a multi-modulus divider, dividing the frequency of the oscillator's output signal by a factor of N. The factor N is selected by a ΣΔ-modulator, comprising a control input for a control signal $Y_{channel}$. With the control signal a desired frequency channel can be selected. The modulator then sets the appropriate divisional factor N. The output signal $\phi_{div}(t)$ of the multi-modulus divider is applied to the second input terminal of the time to digital converter. A reference signal $\phi_{ref}(t)$ is applied to the first input terminal.

The time to digital converter determines the time difference between two rising or falling edges of the signal $\phi_{div}(t)$ in the feedback path and the reference signal $\phi_{ref}(t)$. For this purpose, for example, the feedback signal may be applied for example to the single delay line according the embodiment of FIG. 13 or to a first and second delay line as described in the embodiments according to FIG. 2, 3 or 4. The reference signal can be used to sample the rising edge of the feedback signal and therefore to determine the difference between two rising edges of both signals.

The time difference is determined and combined into a digital word corresponding to a phase difference between the two signals $\phi_{div}(t)$ and $\phi_{ref}(t)$. The digital value e[k] is filtered by the digital loop filter and applied to a DCO control input for selecting the proper frequency.

FIG. 16 shows an embodiment of different method acts for interpolating and measuring a time difference. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

At S1, a first signal having a signal flank or edge is provided. Then, a second signal is generated which is derived from the first signal. For example, the second signal may be inverted with respect to the first signal.

The propagation of the first and second delayed signal is then further delayed at S3 by a specific stage delay. The stage delay can be in the range of the specific delay time of a multiple of the delay time. Both delayed signals are also interpolated, thereby generating intermediate signals derived by the transition of the first and second delayed signal at S4.

The intermediate signal as well as the transition of the delayed signals may be sampled and read out with respect to a reference signal at S5.

Although specific embodiments have been illustrated and described, it will be appreciated by one of ordinary skill in the art that any arrangement which is calculated to achieve the same purpose may be substituted for the specific embodiment shown. It is to be understood that the above description is intended to be illustrative and not restrictive. The application is intended to cover any variations of the invention. The scope of the invention includes any other embodiments and applications in which the above structures and methods may be used. The scope of the invention should therefore be determined with reference to the appended claims along with the scope of equivalence to which such claims are entitled.

It is emphasized that the abstract is provided to comply with 37 CFR. Section 1.72(b) requiring an abstract that will allow the reader to quickly ascertain the nature and gist of a technical disclosure. It is submitted with the understanding that it will not be used to interpret or limit the scope of meaning of the claims.

The invention claimed is:

1. A time delay circuit, comprising:
   a plurality of delay circuits connected in series;
   at least a first interpolation circuit coupled to an output of a first delay circuit of the plurality of delay circuits and to an output of a second delay circuit of the plurality of delay circuits, wherein signals at the outputs of the respective first and second delay circuits comprise statically the same logic level, and wherein the first interpolation circuit is configured to provide at least a first intermediate signal derived by the signals at the outputs of the respective first and second delay circuits;
   wherein the first intermediate signal comprises a rising edge between respective rising edges of the respective signals at the outputs of the respective first and second delay circuits, and further comprises a falling edge between respective falling edges of the respective signals at the outputs of the respective first and second delay circuits.

2. The time delay circuit of claim 1, wherein each of the plurality of delay circuits comprise an inverting signal characteristic.

3. The time delay circuit of claim 1, wherein the at least first interpolation circuit comprises a switch configured to selectively couple the at least first interpolation circuit with the outputs of the first and second delay circuit.

4. The time delay circuit of claim 1, wherein each of the delay circuits comprise an inverter configured to provide an inverted and delayed signal.

5. A time delay circuit, comprising:
   at least a first delay circuit configured to receive a first signal and provide a first delayed signal;
   at least a second delay circuit configured to receive a second signal and provide a second delayed signal, wherein the second signal is derived from the first signal and delayed with respect to the first signal by a delay time; and
   at least a first interpolation circuit coupled to an output of the at least first delay circuit and an output of the at least second delay circuit, wherein the first interpolation circuit is configured to provide at least a first intermediate signal in response to the first delayed signal and the second delayed signal;
   wherein the first interpolation circuit comprises at least two transistors connected in series and a node therebetween to provide the at least first intermediate signal.

6. The time delay circuit of claim 5, wherein the first and second delay circuits comprise a time delay similar or substantially equal to the time delay of the second signal.

7. The time delay circuit of claim 5, wherein the first and second delay circuit comprise an inverter.

8. The time delay circuit of claim 5, wherein the first delay circuit and the second delay circuits comprise a differential inverter or differential amplifier.

9. The time delay circuit of claim 5, further comprising:
a plurality of first delay circuits connected in series;
a plurality of second delay circuits connected in series;
a plurality of interpolation circuits connected between an output of a first delay circuit of the plurality of first delay circuits and a second delay circuit of the plurality of second delay circuits, and configured to provide a plurality of intermediate signals in response to the first delayed signal and the second delayed signal.

10. A time to digital converter, comprising:
at least a first delay circuit configured to receive a first signal and provide a first delayed signal;
at least a second delay circuit configured to receive a second signal and provide a second delayed signal, wherein the second signal is derived from the first signal and inverted with respect to the first signal;
at least a first interpolation circuit coupled to an output of the first delay circuit and an input of the second delay circuit, wherein the first interpolation circuit is configured to provide at least a first intermediate signal in response to the first delayed signal and the second signal;
a first latch circuit coupled to one of the first and second delay circuits via the first interpolation circuit and configured to provide a first bit value in response to a reference signal; and
a second latch circuit coupled to the first interpolation circuit, and configured to provide an intermediate bit value derived from the first intermediate signal in response to the reference signal.

11. The time to digital converter of claim 10, wherein the at least first delay circuit comprises a plurality of first delay circuits connected in series, the at least second delay circuit comprises a plurality of second delay circuits connected in series, and the at least first interpolation circuit comprises a plurality of interpolation circuits configured to provide intermediate signals, wherein each of the interpolation circuits are coupled between an output of a first delay circuit of a respective one of the plurality of the first delay circuits and an input of a respective one of a second delay circuit of the plurality of second delay circuits.

12. The time to digital converter of claim 10, wherein the first and second delay circuit comprises an inverter.

13. The time to digital converter of claim 10, wherein the first delay circuit and the second delay circuit each comprise a differential inverter or a differential amplifier.

14. The time to digital converter of claim 10, wherein the interpolation circuit comprises a voltage divider comprising at least two resistive elements connected in series and a node therebetween to provide the at least first intermediate signal.

15. The time to digital converter of claim 14, wherein at least one of the at least two resistive elements comprises a tuneable resistive element.

16. The time to digital converter of claim 10, wherein the interpolation circuit comprises at least two transistors connected in series and a node therebetween to provide the at least first intermediate signal.

17. The time to digital converter of claim 10, further comprising a switching device with a control input terminal arranged between the at least first interpolation circuit and the output of the first delay circuit and the input of the second delay circuit.

18. The time to digital converter of claim 10, further comprising:
a conversion unit comprising a first inverter chain coupled to the first delay circuit and a second inverter chain coupled to the second delay circuit, wherein the first and second inverter chains each comprise substantially the same delay time and a different number of inverters.

19. The time to digital converter of claim 10, wherein the first and second latch circuits each comprise a flip-flop circuit.

20. A time delay circuit, comprising:
a plurality of delay circuits connected in series;
at least a first interpolation circuit coupled to an output of a first delay circuit of the plurality of delay circuits and to an output of a second delay circuit of the plurality of delay circuits, wherein signals at the outputs of the respective first and second delay circuits comprise statically the same logic level, and wherein the interpolation circuit is configured to provide at least a first intermediate signal derived by the signals at the outputs of the respective first and second delay circuits;
wherein the interpolation circuit comprises a voltage divider with at least two resistive elements.

21. The time delay circuit of claim 20, wherein at least one of the at least two resistive elements comprise a tuneable resistor network.

22. A time delay circuit, comprising:
at least a first delay circuit configured to receive a first signal and provide a first delayed signal;
at least a second delay circuit configured to receive a second signal and provide a second delayed signal, wherein the second signal is derived from the first signal and delayed with respect to the first signal by a delay time; and
at least a first interpolation circuit coupled to an output of the at least first delay circuit and an output of the at least second delay circuit, wherein the interpolation circuit is configured to provide at least a first intermediate signal in response to the first delayed signal and the second delayed signal;
wherein the interpolation circuit comprises a voltage divider comprising at least two resistive elements connected in series and a node therebetween to provide the at least first intermediate signal.

* * * * *